United States Patent
Zheng et al.

(10) Patent No.: US 8,988,770 B2
(45) Date of Patent: Mar. 24, 2015

(54) HYBRID OPTICAL SOURCE WITH SEMICONDUCTOR REFLECTOR

(71) Applicant: Oracle International Corporation, Redwood City, CA (US)

(72) Inventors: Xuezhe Zheng, San Diego, CA (US); Ashok V. Krishnamoorthy, San Diego, CA (US); Ivan Shubin, San Diego, CA (US); John E. Cunningham, San Diego, CA (US); Guoliang Li, San Diego, CA (US); Ying L. Luo, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 191 days.

(21) Appl. No.: 13/831,541

(22) Filed: Mar. 14, 2013

(65) Prior Publication Data
US 2014/0268312 A1    Sep. 18, 2014

(51) Int. Cl.
*H01S 5/10* (2006.01)
*H01S 5/14* (2006.01)

(52) U.S. Cl.
CPC ............. *H01S 5/1028* (2013.01); *H01S 5/1025* (2013.01); *H01S 5/141* (2013.01); *H01S 5/142* (2013.01)
USPC ........................................................ 359/344

(58) Field of Classification Search
CPC ....... H01S 5/1028; H01S 5/141; H01S 5/142; H01S 5/1025; H01S 5/143; H01S 5/18333
USPC ....................................................... 359/344
See application file for complete search history.

(56) References Cited

U.S. PATENT DOCUMENTS

| | | | | |
|---|---|---|---|---|
| 5,003,550 A | * | 3/1991 | Welch et al. | 372/50.22 |
| 5,263,111 A | * | 11/1993 | Nurse et al. | 385/130 |
| 5,321,718 A | * | 6/1994 | Waarts et al. | 372/108 |
| 5,349,602 A | * | 9/1994 | Mehuys et al. | 372/98 |
| 5,485,021 A | * | 1/1996 | Abe | 257/84 |
| 5,499,261 A | * | 3/1996 | Welch et al. | 372/50.11 |
| 5,539,571 A | * | 7/1996 | Welch et al. | 359/344 |
| 5,562,838 A | * | 10/1996 | Wojnarowski et al. | 216/24 |
| 6,148,013 A | * | 11/2000 | Geels et al. | 372/46.01 |
| 6,748,002 B2 | * | 6/2004 | Shveykin | 372/45.01 |
| 7,126,750 B2 | * | 10/2006 | Wasserbauer | 359/344 |
| 7,184,386 B2 | * | 2/2007 | Nikolai et al. | 369/112.09 |
| 7,343,058 B2 | * | 3/2008 | Block et al. | 385/14 |
| 7,650,052 B2 | * | 1/2010 | Krishnamoorthy et al. | 385/14 |
| 7,915,699 B2 | * | 3/2011 | Krishnamoorthy et al. | 257/428 |
| 7,916,768 B2 | * | 3/2011 | Chang et al. | 372/50.124 |

(Continued)

*Primary Examiner* — Ari M Diacou
(74) *Attorney, Agent, or Firm* — Park, Vaughan, Fleming & Dowler LLP; Steven E. Stupp

(57) ABSTRACT

A hybrid optical source that provides an optical signal having a wavelength is described. This hybrid optical source includes an edge-coupled optical amplifier (such as a III-V semiconductor optical amplifier) aligned to a semiconductor reflector (such as an etched silicon mirror). The semiconductor reflector efficiently couples (i.e., with low optical loss) light out of the optical amplifier in a direction approximately perpendicular to a plane of the optical amplifier. A corresponding optical coupler (such as a diffraction grating or a mirror) fabricated on a silicon-on-insulator chip efficiently couples the light into a sub-micron silicon-on-insulator optical waveguide. The silicon-on-insulator optical waveguide couples the light to additional photonic elements (including a reflector) to complete the hybrid optical source.

20 Claims, 5 Drawing Sheets

(56) References Cited

U.S. PATENT DOCUMENTS

| | | |
|---|---|---|
| 8,148,202 B2 * | 4/2012 | Krishnamoorthy et al. .. 438/109 |
| 8,548,288 B2 * | 10/2013 | Raj et al. .................... 385/14 |
| 8,666,211 B2 * | 3/2014 | Kopp et al. .................. 385/49 |
| 8,781,276 B2 * | 7/2014 | Fattal et al. ................. 385/49 |
| 2002/0012372 A1 * | 1/2002 | Shveykin .................... 372/45 |
| 2002/0097762 A1 * | 7/2002 | Marsh et al. ................. 372/46 |
| 2003/0156617 A1 * | 8/2003 | Baney et al. ................. 372/96 |
| 2007/0019899 A1 * | 1/2007 | Ohtsu et al. ................. 385/14 |

* cited by examiner

HYBRID OPTICAL SOURCE WITH SEMICONDUCTOR REFLECTOR

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure generally relates to the design of a hybrid optical source. More specifically, the present disclosure relates to the design of a hybrid optical source with optical proximity coupling between a semiconductor reflector and a grating coupler.

2. Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low power (for example, less than 1 pJ/bit) optical interconnect, a high-efficiency optical source, such as a semiconductor laser or a laser source, is typically required. In particular, the required power consumption of the laser source may need to be 0.4 pJ/bit, and the required optical-waveguide-coupled wall-plug efficiency (defined as the laser power coupled into a silicon optical waveguide divided by the total consumed electrical power) of such a laser source usually needs to be greater than 10%. (While the energy cost of the laser source can, in principle, be better amortized at higher data rates, in practice receiver sensitivity decreases at higher data rates because there is less received photon energy per bit and the power consumption of receiver circuits using a given CMOS technology typically grows super-linearly with the data rate.) In addition, if silicon-photonic resonator devices (such as ring modulators) are used in an optical interconnect, the spectral linewidth of the laser source may need to be less than 10 pm.

However, most state-of-the-art laser sources have a wall-plug efficiency of only 1-2%. In these laser sources, a large amount (in excess of 80%) of the electrical power is usually consumed by thermal-electric cooling (TEC) to maintain high-power (greater than 10 mW) lasing with stable wavelength and good slope efficiency. While uncooled laser sources with sufficient wall-plug efficiency (around 10%) and output power (for example, 2-4 mW) are available for use in optical interconnects, the wavelength stability of these laser sources is often larger than 100 pm (because of the lack of temperature control), which is unsuitable for dense wavelength-division-multiplexing links. In addition, these laser sources are usually based on III-V semiconductors (such as indium phosphide, etc.). The large optical coupling loss between an optical waveguide in the III-V semiconductor laser source and a silicon optical waveguide could reduce the efficiency by 3-10 times.

Hence, what is needed is an optical source without the problems described above.

SUMMARY

One embodiment of the present disclosure provides a hybrid optical source that includes: an optical amplifier that provides an optical signal having a range of wavelengths; a semiconductor reflector, mechanically and optically coupled to the optical amplifier, which reflects the optical signal over the range of wavelengths to change a direction of propagation of the optical signal; and a semiconductor-on-insulator chip optically coupled to the semiconductor reflector. Moreover, the semiconductor-on-insulator chip includes: a substrate; an oxide layer disposed on the substrate; and a semiconductor layer disposed on the oxide layer and having a surface facing the semiconductor reflector. Furthermore, the semiconductor layer includes: an optical coupler that redirects the optical signal to and from a plane of the semiconductor layer; an optical waveguide that conveys the optical signal; and a reflector that at least partially reflects a wavelength in the optical signal. Note that the optical amplifier, the semiconductor reflector, the optical coupler, the optical waveguide and the reflector define an optical cavity in the hybrid optical source.

In some embodiments, the optical coupler includes a diffraction grating.

Moreover, the optical amplifier includes a semiconductor optical amplifier. For example, the semiconductor optical amplifier may include a III-V semiconductor.

Furthermore, the wavelength reflected by the reflector may be tunable.

Note that the reflector may include a mirror.

Additionally, the semiconductor reflector may include a mirror etched into a semiconductor substrate. For example, the semiconductor substrate may include a cavity defined by an edge, and the optical amplifier may be disposed in the cavity so that the optical amplifier and the semiconductor reflector are aligned. Note that the semiconductor substrate may include silicon.

In some embodiments, a distance between the semiconductor reflector and the surface of the semiconductor layer is less than a predefined length so that divergence of the optical signal is reduced during optical coupling between the semiconductor reflector and the optical coupler.

Note that the semiconductor layer may include silicon. Thus, in some embodiments the semiconductor-on-insulator chip includes a silicon-on-insulator chip.

Another embodiment provides a system that includes: a processor, memory, and the hybrid optical source.

Another embodiment provides a method for providing the optical signal having the wavelength. During the method, the optical signal having the range of wavelengths is output from the optical amplifier. Then, the optical signal is reflected over the range of wavelengths to change the direction of propagation of the optical signal using the semiconductor reflector mechanically and optically coupled to the optical amplifier. Moreover, the optical signal is redirected to and from the plane of the semiconductor layer in the semiconductor-on-insulator chip optically coupled to the semiconductor reflector using the optical coupler in the semiconductor layer. Note that the semiconductor-on-insulator chip includes: the substrate, the oxide layer disposed on the substrate, and the semiconductor layer disposed on the oxide layer and having the surface facing the semiconductor reflector. Next, the optical signal is conveyed in the optical waveguide in the semiconductor layer. Furthermore, the wavelength is at least partially reflected in the optical signal using the reflector in the semiconductor layer, where the optical amplifier, the semiconductor reflector, the optical coupler, the optical waveguide and the reflector define the optical cavity.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
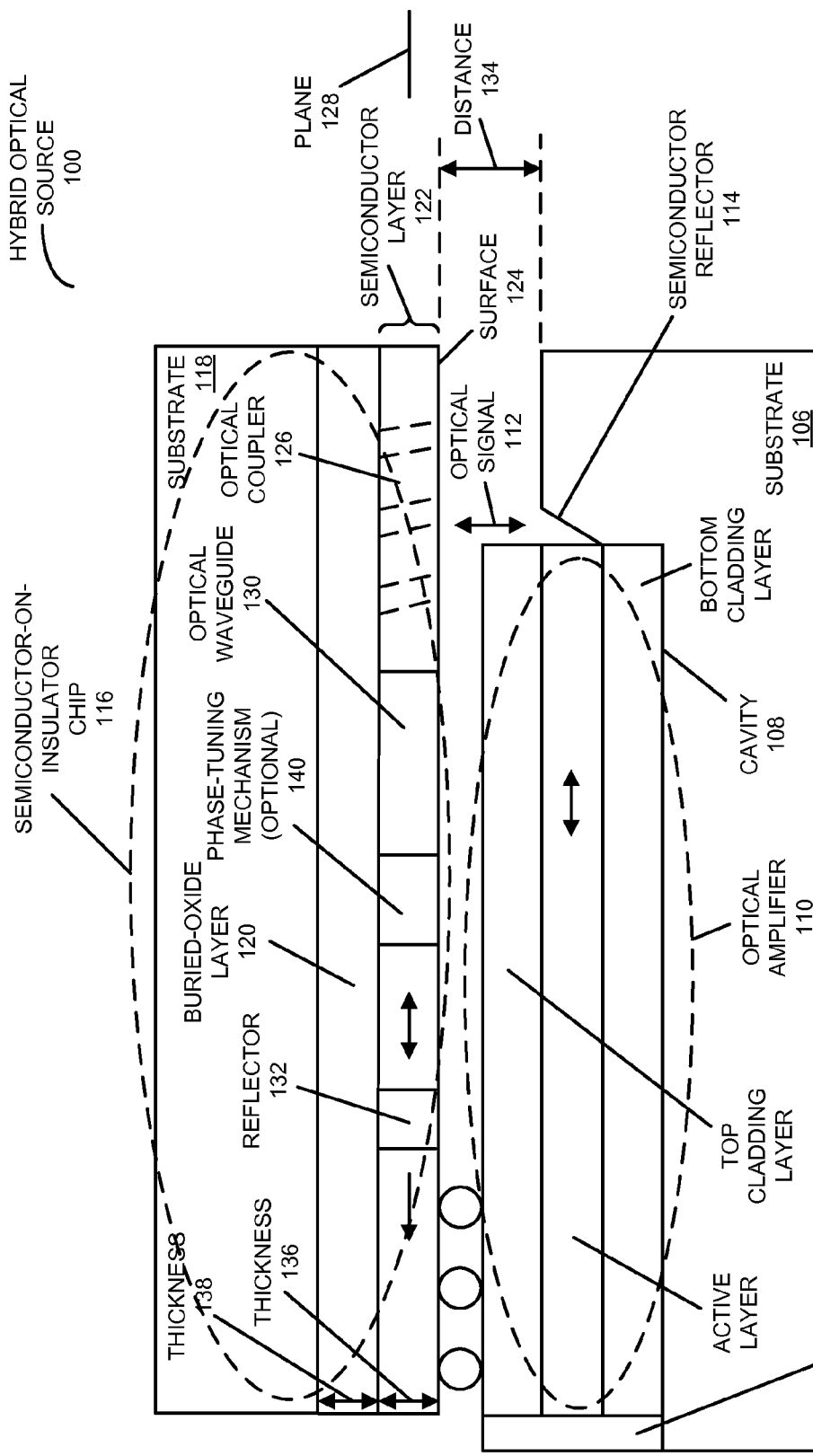
FIG. 1 is a block diagram illustrating a side view of a hybrid optical source in accordance with an embodiment of the present disclosure.

Embodiments of a hybrid optical source, a system that includes the hybrid optical source, and a method for providing an optical signal having a wavelength are described. This hybrid optical source includes an edge-coupled optical amplifier (such as a III-V semiconductor optical amplifier) aligned to a semiconductor reflector (such as an etched silicon mirror). The semiconductor reflector efficiently couples (i.e., with low optical loss) light out of the optical amplifier in a direction approximately perpendicular to a plane of the optical amplifier. A corresponding optical coupler (such as a diffraction grating or a mirror) fabricated on a silicon-on-insulator chip efficiently couples the light into a sub-micron silicon-on-insulator optical waveguide. The silicon-on-insulator optical waveguide couples the light to additional photonic elements including a reflector to complete the hybrid optical source.

In this way, the hybrid optical source can provide a laser source with high wall-plug efficiency and narrow lasing linewidth, thereby facilitating high-performance optical interconnects for use in applications such as high-performance computing.

We now describe embodiments of the hybrid optical source. A variety of approaches have been proposed to make an efficient laser source for use in silicon-photonic links. These approaches typically require integration, with low optical losses, of a gain or active medium on an optical-amplifier chip (such as a III-V semiconductor chip, which is sometimes referred to as a 'III-V optical-amplifier chip') with an optical waveguide on a silicon-on-insulator chip. However, an optical waveguide on a III-V optical-amplifier chip typically has an optical mode with a diameter of 2-3 µm, while the diameter of the optical mode in an optical waveguide on a silicon-on-insulator chip is typically less than 1 µm. Although it is possible to integrate tapers on either or both of the optical waveguides to better match the sizes of their optical modes, it is generally very difficult to achieve butt-coupling for optical waveguides with such small modes. As a consequence, alignment tolerances may be very tight, which can make the integration/packaging impractical for production. In addition, butt-coupling may not be a suitable option for dense, large-scale integration, because it can only be done at the edge of the III-V optical-amplifier chip and the silicon-on-insulator chip, which presents severe constraints to the system design.

Therefore, it is desirable to develop structures on both chips for surface-normal optical coupling with improved alignment tolerance.

One potential hybrid integration approach attempts to address this problem using optical couplers (such as diffraction gratings or 'grating couplers') on both the III-V optical-amplifier chip and the silicon-on-insulator chip for surface-normal optical coupling. However, it is difficult to efficiently couple light between the III-V optical-amplifier chip and the silicon-on-insulator chip using grating couplers.

Grating couplers for efficient inter-chip optical coupling have been developed in optical waveguides having thicknesses less than 1 µm on silicon-on-insulator chips. For example, one such grating coupler uses a taper and $2^{nd}$-order diffraction gratings to convert the optical mode in a horizontal sub-micron optical waveguide to a vertically propagating optical mode with a size of tens of microns (and vice versa). A grating coupler on a silicon-on-insulator chip has been implemented with an inter-chip optical-coupling loss of 2.8 dB and a vertical mode diameter of approximately 10 µm. By adding a backside mirror, this design can be further improved to an optical loss of less than 2 dB and an even larger vertical optical-mode size. A vertical optical-mode diameter of 10-50 µm is thought to be in the optimum range for the tradeoff between alignment tolerance and footprint.

However, on the III-V optical-amplifier chip, there is no good solution yet to convert the horizontal optical mode into a vertical propagating optical mode with a 10-50 µm optical-mode diameter. In particular, because of the relatively low index-of-refraction contrast (and, thus, weak optical-mode confinement) in optical waveguides on the III-V optical-amplifier chip, in practice a grating coupler on an optical waveguide on the III-V optical-amplifier chip is typically less efficient than a grating coupler on an optical waveguide on the silicon-on-insulator chip.

An optical waveguide on a III-V optical-amplifier chip normally consists of: an upper cladding layer of lower index-of-refraction material (such as a first type of doped III-V semiconductor, e.g., n-type or p-type indium phosphide), a core layer of higher index-of-refraction material (such as indium gallium arsenide phosphide, aluminum indium gallium arsenide or quantum wells), a bottom cladding layer (such as a second type of doped III-V semiconductor, which may be different than the first type of doped III-V semiconductor, e.g., p-type or n-type indium phosphide), and a substrate (such as an undoped III-V semiconductor, e.g., indium phosphide). The upper cladding layer is usually pretty thick (approximately 2 µm) so that the optical mode confined around the core layer can stay far away from the top surface of the optical waveguide where there is usually a metal contact. This can minimize optical loss induced by metal absorption. If trenches are etched from the top of such an optical waveguide to form a grating coupler, the trench-scattering strength may be very weak unless deep trenches (greater than 2 µm) are etched through the core layer. Such deep trenches are typically difficult to fabricate because the trench width of a $2^{nd}$-order diffraction grating is 200-300 nm. For such narrow trenches, it is difficult to have a depth greater than 1 µm because any etched feature has a limited aspect ratio. With such shallow and weak trenches, the grating couplers usually have a length of several hundred micrometers. However, such a large grating coupler usually cannot efficiently optically couple with the grating couplers on the silicon-on-insulator chip. In addition, there are usually large optical losses when the optical mode propagates in such a long grating coupler. Therefore, a grating coupler in an optical waveguide on a III-V optical-amplifier chip is likely to be very inefficient.

Figure 2:
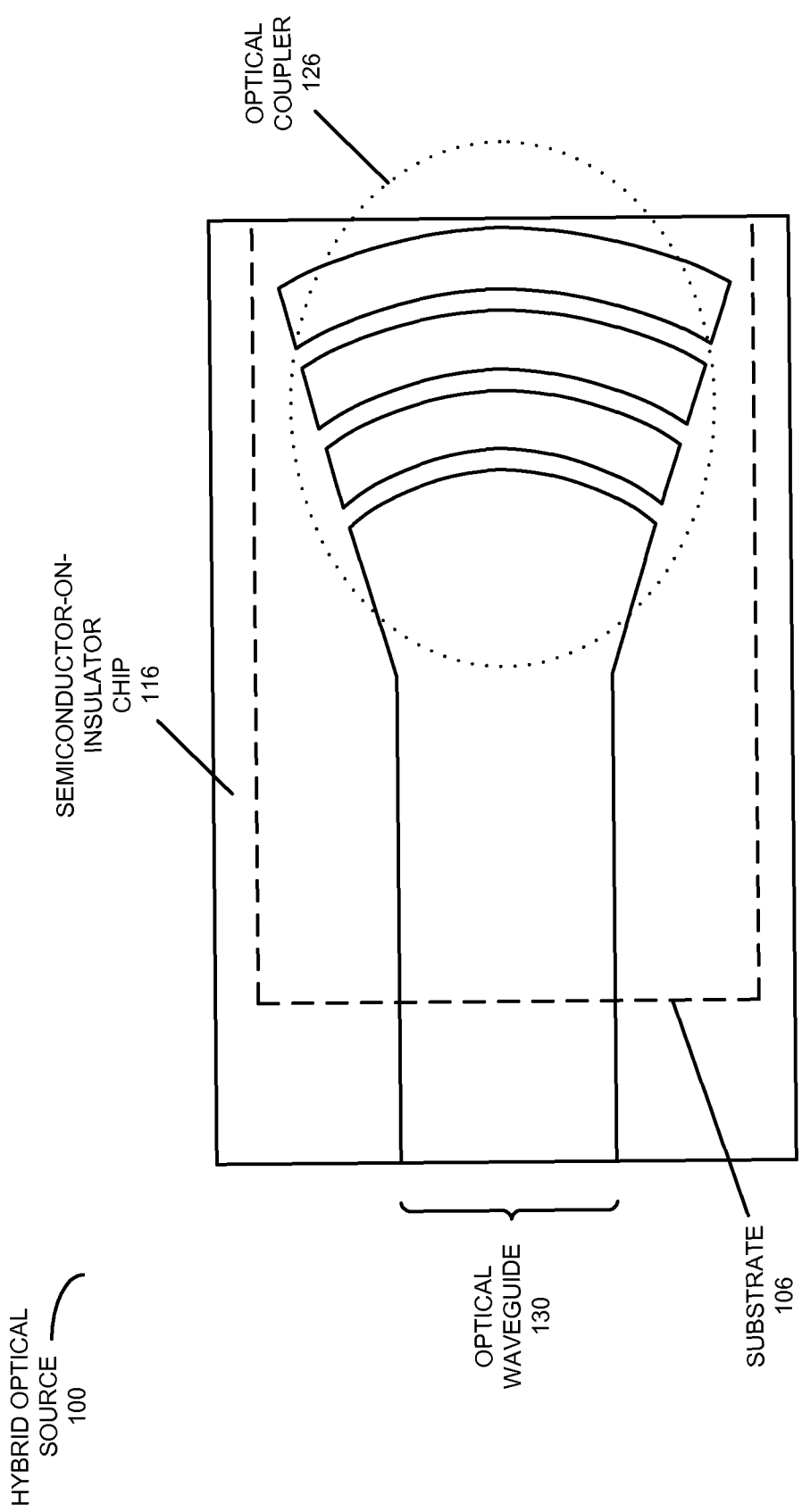
FIG. 2 is a block diagram illustrating a top view of the hybrid optical source of FIG. 1 in accordance with an embodiment of the present disclosure.

To solve this problem, a hybrid optical source includes a separate semiconductor reflector to redirect the light output by the optical-amplifier chip in the surface-normal direction. This is shown in FIG. 1, which presents a block diagram illustrating a side view of a hybrid optical source 100, and FIG. 2, which presents a block diagram illustrating a top view of hybrid optical source 100. This hybrid optical source includes an edge-emitter optical amplifier 110 that provides an optical signal 112 (or light) having a range of wavelengths. For example, optical amplifier 110 may include a semiconductor optical amplifier (such as a reflective semiconductor optical amplifier or a semiconductor laser) with gain induced by current injection. In some embodiments, the semiconductor optical amplifier includes a III-V semiconductor. Thus, the semiconductor optical amplifier may include an active layer having a bandgap wavelength that exceeds that of silicon.

Moreover, hybrid optical source 100 includes a semiconductor reflector 114, mechanically and optically coupled to optical amplifier 110, which reflects optical signal 112 over the range of wavelengths to change a direction of propagation of optical signal 112. In an exemplary embodiment, semiconductor reflector 114 may include a mirror etched into a semiconductor substrate 106 (such as a mirror etched at 54.7° in silicon) or a cleaved facet with a high-reflectivity coating. This semiconductor reflector may cover the entire range of wavelengths output by a III-V semiconductor optical amplifier.

In some embodiments, semiconductor substrate 106 includes a cavity 108 defined by an edge in a surface of substrate 106, and optical amplifier 110 may be disposed in cavity 108 so that optical amplifier 110 and semiconductor reflector 114 are aligned. For example, semiconductor reflector 114 may be defined by a crystal plane and the registration provided by semiconductor substrate 106 may facilitate a multi-channel optical source. Note that the mirror may be fabricated using a wet-etching technique and the cavity in the semiconductor substrate may be fabricated using a dry-etching technique. However, in other embodiments the mirror etched into semiconductor substrate 106 is independently mechanically coupled to optical amplifier 110. For example, the mirror may be glued onto optical amplifier 110.

Furthermore, hybrid optical source 100 includes a semiconductor-on-insulator chip 116 optically coupled to semiconductor reflector 114. This semiconductor-on-insulator chip may include: a substrate 118; an oxide layer 120 (which is sometimes referred to as a 'buried-oxide layer') disposed on substrate 118; and a semiconductor layer 122 disposed on oxide layer 120 and having a surface 124 facing semiconductor reflector 114. Note that semiconductor layer 122 may include silicon. Thus, in some embodiments semiconductor-on-insulator chip 116 includes a silicon-on-insulator chip and, therefore, is a silicon photonic chip.

Semiconductor layer 122 includes: an optical coupler 126 (such as a diffraction grating or a grating coupler, or a mirror) that redirects optical signal 112 to and from a plane 128 of semiconductor layer 122; an optical waveguide 130 that conveys optical signal 112; and a reflector 132 (such as an etched mirror) that at least partially reflects a wavelength in optical signal 112. If a first order of the diffraction grating is used to couple the optical signal into and out of plane 128, it may be difficult to fabricate the diffraction grating (for example, the period of the diffraction grating may be 300 nm). Therefore, a diffraction order of the diffraction grating greater than one (such as a diffraction order of two) may be used to couple optical signal 112 into and out of plane 128, and the diffraction grating may have a length less than 75 μm. Furthermore, the diffraction grating may be at an angle relative to plane 128, where the angle is other than 0 or 90°. For example, the diffraction grating may be a blazed grating with dry etched teeth at the (blaze) angle of 75-85°. Note that the diffraction grating may match semiconductor reflector 114 so that optical signal 112 is directed to and from plane 128. In addition, reflector 132 may include: a ring resonator, a distributed Bragg reflector or a first-order diffraction grating. In some embodiments, the wavelength reflected by reflector 132 may be tunable. For example, reflector 132 may be thermally tuned.

In hybrid optical source 100, optical signal 112 is confined in the waveguides in optical amplifier 110 (i.e., the III-V optical-amplifier chip) and semiconductor-on-insulator chip 116. Optical signal 112 propagates in free-space (or in an equivalently transparent optical material, such as underfill) between the facet of semiconductor reflector 114 and optical coupler 126. Such bidirectional coupling between optical amplifier 110 and reflector 132 on semiconductor-on-insulator chip 116 creates a hybrid optical cavity for an external optical-cavity tunable laser source using wavelength-selective optical feedback from circuits on semiconductor-on-insulator chip 116, in which optical amplifier 110 provides optical gain while reflector 132 controls the lasing wavelength. Thus, the optical cavity consists of three semiconductor substrates or chips, and includes: optical amplifier 110, semiconductor reflector 114, optical coupler 126, optical waveguide 130 and reflector 132.

In some embodiments, a distance 134 between semiconductor reflector 114 and surface 124 of semiconductor layer 122 is less than a predefined length (such as a couple of microns) so that divergence of optical signal 112 is reduced during optical coupling between semiconductor reflector 114 and optical coupler 126. Distance 134 may also ensure that the size or diameter of the optical mode from semiconductor reflector 114 matches that of optical coupler 126.

In this way, hybrid optical source 100 may provide low-loss (high-efficiency, proximity) optical coupling between optical amplifier 110 and semiconductor-on-insulator chip 116 (and, in particular, into optical waveguide 130). The resulting hybrid optical source combines the gain of a III-V semiconductor with the efficient wavelength control of silicon photonics, and thus can provide: a high wall-plug efficiency, a narrow lasing linewidth, a small footprint, low cost and high-yield integration. Moreover, even though the optical modes in optical amplifier 110 and the (silicon) optical waveguide 130 are very different, they can be matched in free space so that the optical coupling loss is less than 2 dB. Thus, hybrid optical source 100 may facilitate a low-power (<1 pJ/bit) silicon-photonic interconnect or link.

In an exemplary embodiment, the range of wavelengths of optical signal 112 is between 1.1-1.7 μm. For example, hybrid optical source 100 may be a laser providing optical signal 112 having a fundamental wavelength of 1.3 or 1.55 μm. Moreover, semiconductor layer 122 may have a thickness 136 that is less than 1 μm (such as 0.2-0.3 μm). Furthermore, oxide layer 120 may have a thickness 138 between 0.3 and 3 μm (such as 0.8 μm).

In some embodiments, optical amplifier 110 is uncooled and the wavelength is controlled by reflector 132. By backside etching substrate 118 to create one or more etch pits, reflector 132 may have improved thermal sensitivity so as to make the thermal tuning of hybrid optical source 100 ultra-efficient (i.e., very low power). In addition to reflector 132, semiconductor-on-insulator chip 116 may provide circuits, devices or components for fixing, tuning, monitoring, and controlling the wavelength of hybrid optical source 100, as well as cooling, to achieve the requisite tuning range, lasing linewidth and feedback control. In some embodiments, semiconductor layer 122 includes an optional phase-tuning mechanism 140 (which may be based on a thermal tuning or carrier-based index modulation) that adjusts the phase of optical signal 112. This phase tuning may ensure that the proper optical-cavity length can be created to ensure coherent resonant feedback at the wavelength.

Additionally, a reflecting layer (not shown) may be added at the bottom of optical coupler 126 to minimize the optical loss due to leaking through substrate 118. Such a reflecting layer can be a metal mirror deposited in a pit etched at the backside of optical coupler 126. In some embodiments, a top surface of optical amplifier 110 is passivated with either silicon dioxide or a polymer that has a very low index of refraction (such as 1.5).

In some embodiments, semiconductor reflector 114 and optical coupler 126 are used to efficiently optically couple optical signal 112 from optical amplifier 110 to semiconductor-on-insulator chip 116. However, optical feedback from the circuits on semiconductor-on-insulator chip 116 is avoided by using an isolator in between optical amplifier 110 and these circuits. In addition, an imaging system with a ball-lens may be used to unidirectionally couple optical signal 112 from optical amplifier 110 to optical waveguide 130 via optical coupler 126

Figure 3:
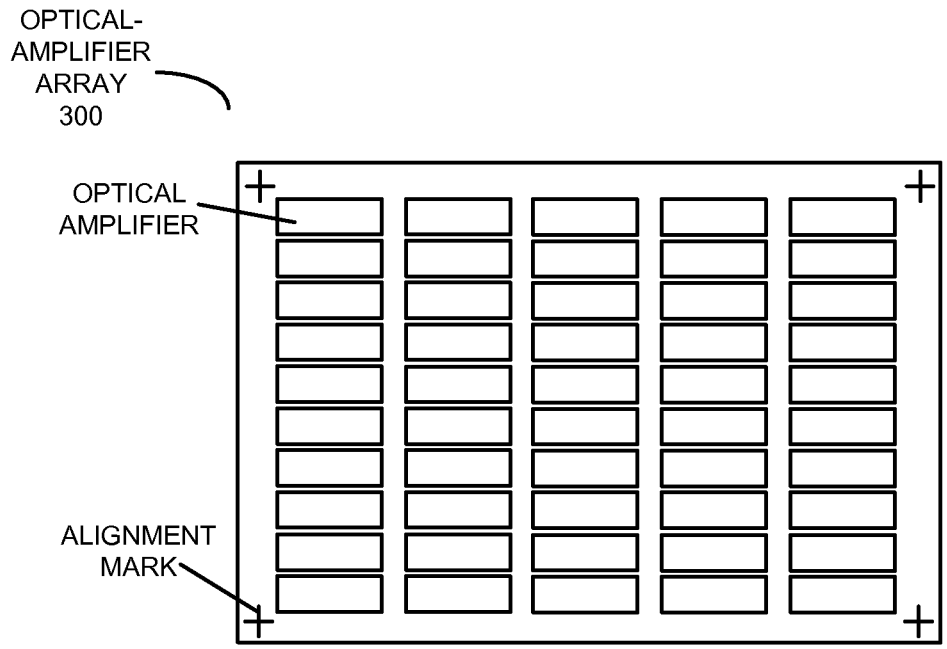
FIG. 3 is a block diagram illustrating a top view of an optical-amplifier array in accordance with an embodiment of the present disclosure.
Figure 4:
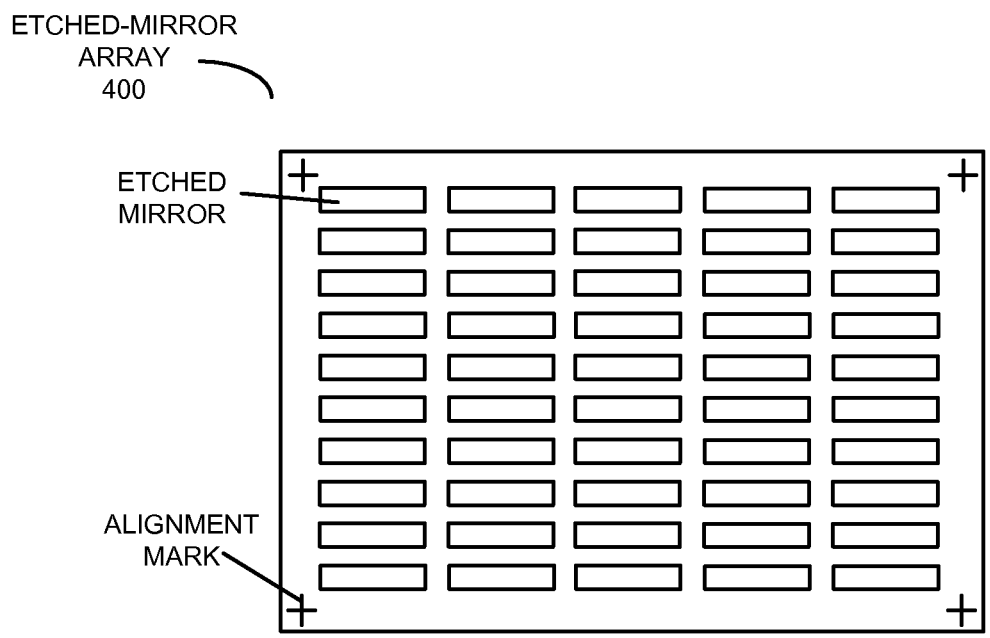
FIG. 4 is a block diagram illustrating a top view of an etched-mirror array in accordance with an embodiment of the present disclosure.

As shown in FIG. 3, which presents a block diagram illustrating a top view of an optical-amplifier array 300, the hybrid optical source may be extended to provide a multi-wavelength tunable array of light-sources that can be concurrently created using a single attachment of optical-amplifier array 300 (which may contain multiple semiconductor optical amplifiers) to semiconductor-on-insulator chip 116 (which may contain multiple instances of the optical couplers and the associated photonic components needed to create practical, efficient wavelength-division-multiplexing laser sources). Each semiconductor bar in optical-amplifier array 300 may include arrays of optical amplifiers with alignment marks on both ends of the bar. As shown in FIG. 4, which presents a block diagram illustrating a top view of an etched-mirror array 400, a semiconductor carrier chip (such as substrate 106) may be micro-machined with multiple slots matching the thickness, length and alignment marks of the optical amplifiers in the semiconductor bar to concurrently and accurately integrate multiple semiconductor bars. Moreover, each cavity slot includes an etched mirror facet with accurate reflecting angle, shared by all the optical amplifiers within optical-amplifier array 300. Using such a hybrid-integration approach, a two-dimensional array of optical amplifiers can be transferred onto semiconductor-on-insulator chip 116 with accurate positioning and uniform beam-pointing angle. Therefore, this hybrid-integration approach may be used to integrate optical-amplifier array 300 with semiconductor-on-insulator chip 116 with a matching array of circuits and optical couplers (such as grating couplers) to build a multi-wavelength tunable array of light sources.

Figure 5:
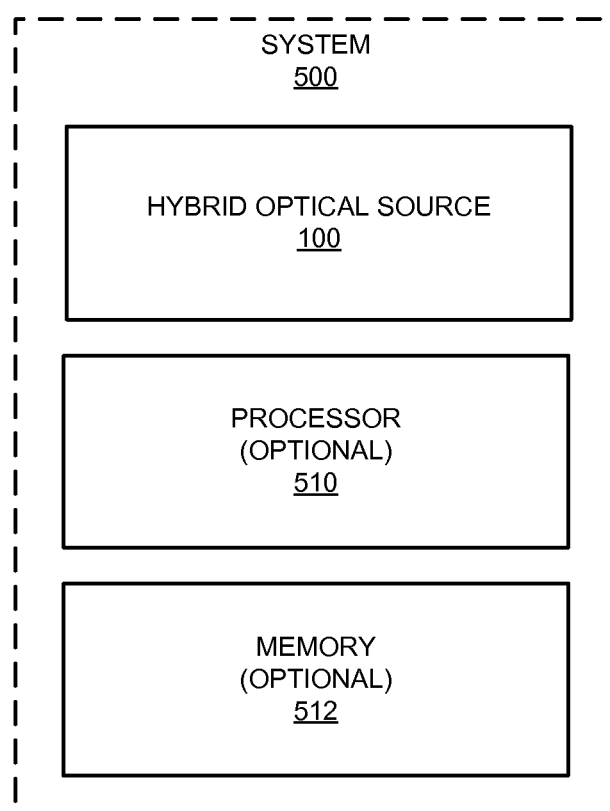
FIG. 5 is a block diagram illustrating a system that includes the hybrid optical source in accordance with an embodiment of the present disclosure.

We now describe the system. FIG. 5 presents a block diagram illustrating a system 500 that includes: hybrid optical source 100, an optional processor 510, and optional memory 512.

As noted previously, hybrid optical source 100 can be used as an external optical source to provide optical power to a silicon photonic chip, a silicon-photonic interconnect or link, or an optical fiber. More generally, hybrid optical source 100 can be used in a wide variety of applications, including communications, welding, medicine, etc. As a consequence, system 500 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a workstation, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the hybrid optical source and/or the system may include fewer components or additional components. Moreover, the substrates may include: a semiconductor die (such as silicon), a ceramic, an organic material and/or glass.

Although the hybrid optical source and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

Note that components in the preceding embodiments of the hybrid optical source and the system may be fabricated using a wide variety of techniques, as is known to one of skill in the art.

Figure 6:
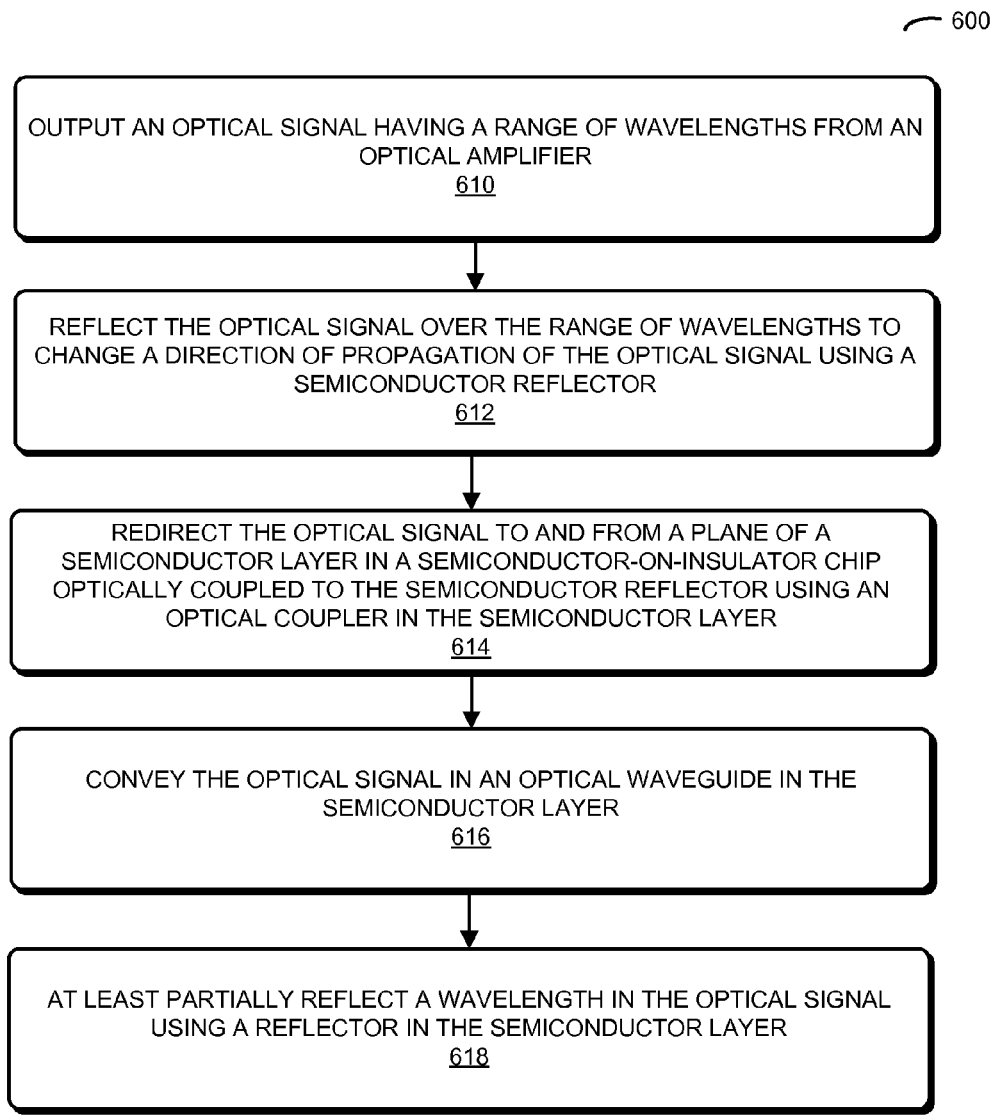
FIG. 6 is a flow diagram illustrating a method for providing an optical signal having a wavelength in accordance with an embodiment of the present disclosure.

We now describe the method. FIG. 6 presents a flow diagram illustrating a method 600 for providing an optical signal having a wavelength, which may be performed by a hybrid optical source (such as hybrid optical source 100 in FIGS. 1-2 and 5). During the method, the optical signal having a range of wavelengths is output from an optical amplifier (operation 610). Then, the optical signal is reflected over the range of wavelengths to change a direction of propagation of the optical signal using a semiconductor reflector (operation 612) mechanically and optically coupled to the optical amplifier. Moreover, the optical signal is redirected to and from a plane of a semiconductor layer in a semiconductor-on-insulator chip optically coupled to the semiconductor reflector using an optical coupler in the semiconductor layer (operation 614). Note that the semiconductor-on-insulator chip includes: a substrate, an oxide layer disposed on the substrate, and a semiconductor layer disposed on the oxide layer and having a surface facing the semiconductor reflector. Next, the optical signal is conveyed in the optical waveguide in the semiconductor layer (operation 616). Furthermore, a wavelength is at least partially reflected in the optical signal using a reflector in the semiconductor layer (operation 618), where the optical amplifier, the semiconductor reflector, the optical coupler, the optical waveguide and the reflector define an optical cavity.

In some embodiments of method 600, there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A hybrid optical source, comprising:
an optical amplifier configured to provide an optical signal having a range of wavelengths;
a semiconductor reflector, mechanically and optically coupled to the optical amplifier, configured to reflect the optical signal over the range of wavelengths to change a direction of propagation of the optical signal; and
a semiconductor-on-insulator chip optically coupled to the semiconductor reflector, wherein the semiconductor-on-insulator chip includes:
a substrate;
an oxide layer disposed on the substrate; and
a semiconductor layer disposed on the oxide layer and having a surface facing the semiconductor reflector, wherein the semiconductor layer includes:
an optical coupler configured to redirect the optical signal to and from a plane of the semiconductor layer;
an optical waveguide configured to convey the optical signal; and
a reflector configured to at least partially reflect a wavelength in the optical signal, wherein the optical amplifier, the semiconductor reflector, the optical coupler, the optical waveguide and the reflector define an optical cavity in the hybrid optical source.

2. The hybrid optical source of claim 1, wherein the optical coupler includes a diffraction grating.

3. The hybrid optical source of claim 1, wherein the optical amplifier includes a semiconductor optical amplifier.

4. The hybrid optical source of claim 3, wherein the semiconductor optical amplifier includes a III-V semiconductor.

5. The hybrid optical source of claim 1, wherein the wavelength reflected by the reflector is tunable.

6. The hybrid optical source of claim 1, wherein the reflector includes a mirror.

7. The hybrid optical source of claim 1, wherein the semiconductor reflector includes a mirror etched into a semiconductor substrate.

8. The hybrid optical source of claim 7, wherein the semiconductor substrate includes a cavity defined by an edge; and
wherein the optical amplifier is disposed in the cavity so that the optical amplifier and the semiconductor reflector are aligned.

9. The hybrid optical source of claim 7, wherein the semiconductor substrate includes silicon.

10. The hybrid optical source of claim 1, wherein a distance between the semiconductor reflector and the surface of the semiconductor layer is less than a predefined length so that divergence of the optical signal is reduced during optical coupling between the semiconductor reflector and the optical coupler.

11. The hybrid optical source of claim 1, wherein the semiconductor layer includes silicon.

12. A system, comprising:
a processor;
memory; and
a hybrid optical source, wherein the hybrid optical source includes:
an optical amplifier configured to provide an optical signal having a range of wavelengths;
a semiconductor reflector, mechanically and optically coupled to the optical amplifier, configured to reflect the optical signal over the range of wavelengths to change a direction of propagation of the optical signal; and
a semiconductor-on-insulator chip optically coupled to the semiconductor reflector, wherein the semiconductor-on-insulator chip includes:
a substrate;
an oxide layer disposed on the substrate; and
a semiconductor layer disposed on the oxide layer and having a surface facing the semiconductor reflector, wherein the semiconductor layer includes:
an optical coupler configured to redirect the optical signal to and from a plane of the semiconductor layer;
an optical waveguide configured to convey the optical signal; and
a reflector configured to at least partially reflect a wavelength in the optical signal, wherein the optical amplifier, the semiconductor reflector, the optical coupler, the optical waveguide and the reflector define an optical cavity in the hybrid optical source.

13. The system of claim 12, wherein the optical coupler includes a diffraction grating.

14. The system of claim 12, wherein the optical amplifier includes a semiconductor optical amplifier.

15. The system of claim 12, wherein the wavelength reflected by the reflector is tunable.

16. The system of claim 12, wherein the reflector includes a mirror.

17. The system of claim 12, wherein the semiconductor reflector includes a mirror etched into a semiconductor substrate.

18. The system of claim 17, wherein the semiconductor substrate includes a cavity defined by an edge; and
wherein the optical amplifier is disposed in the cavity so that the optical amplifier and the semiconductor reflector are aligned.

19. The system of claim 17, wherein the semiconductor substrate includes silicon.

20. A method for providing an optical signal having a wavelength, the method comprising:
outputting an optical signal having a range of wavelengths from an optical amplifier;
reflecting the optical signal over the range of wavelengths to change a direction of propagation of the optical signal using a semiconductor reflector mechanically and optically coupled to the optical amplifier;
redirecting the optical signal to and from a plane of a semiconductor layer in a semiconductor-on-insulator chip optically coupled to the semiconductor reflector using an optical coupler in the semiconductor layer, wherein the semiconductor-on-insulator chip includes: a substrate, an oxide layer disposed on the substrate, and the semiconductor layer disposed on the oxide layer and having a surface facing the semiconductor reflector;
conveying the optical signal in an optical waveguide in the semiconductor layer; and at least partially reflecting the wavelength in the optical signal using a reflector in the semiconductor layer, wherein the optical amplifier, the semiconductor reflector, the optical coupler, the optical waveguide and the reflector define an optical cavity.

* * * * *

UNITED STATES PATENT AND TRADEMARK OFFICE
CERTIFICATE OF CORRECTION

PATENT NO. : 8,988,770 B2  
APPLICATION NO. : 13/831541  
DATED : March 24, 2015  
INVENTOR(S) : Zheng et al.

Page 1 of 1

It is certified that error appears in the above-identified patent and that said Letters Patent is hereby corrected as shown below:

In the specification

In column 7, line 26, delete "coupler 126" and insert -- coupler126. --, therefor.

Signed and Sealed this  
Third Day of November, 2015

Michelle K. Lee  
*Director of the United States Patent and Trademark Office*